United States Patent
Liu et al.

(10) Patent No.: US 10,079,591 B2
(45) Date of Patent: Sep. 18, 2018

(54) RESISTANCE CALIBRATION CIRCUIT AND DEVICE

(71) Applicant: REALTEK SEMICONDUCTOR CORPORATION, Hsinchu (TW)

(72) Inventors: Kai-Yin Liu, Hsinchu (TW); Hui-Min Huang, Yunlin County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/694,550

(22) Filed: Sep. 1, 2017

(65) Prior Publication Data

US 2018/0138895 A1 May 17, 2018

(30) Foreign Application Priority Data

Nov. 17, 2016 (TW) .............................. 105137693 A

(51) Int. Cl.
*H03H 11/30* (2006.01)
*G05F 3/26* (2006.01)

(52) U.S. Cl.
CPC ............. *H03H 11/30* (2013.01); *G05F 3/262* (2013.01)

(58) Field of Classification Search
CPC ....... H03H 11/30; H03H 326/30; G05F 3/262
See application file for complete search history.

(56) References Cited

U.S. PATENT DOCUMENTS 6,862,714 B2 * 3/2005 Jin ........................... H03H 7/24
333/124
7,170,364 B2 1/2007 Lee et al.
7,782,078 B2 * 8/2010 Koo ....................... G11C 5/063
326/30
9,250,642 B2 2/2016 Wu
2003/0102932 A1 * 6/2003 Lee ........................... H03H 7/40
333/17.3

(Continued)

FOREIGN PATENT DOCUMENTS

CN 104834341 A 8/2015

OTHER PUBLICATIONS

English abstract translation of CN104834341A.

*Primary Examiner* — Dylan White
(74) *Attorney, Agent, or Firm* — WPAT, PC

(57) ABSTRACT

The present invention discloses a resistance calibration circuit. An embodiment of the resistance calibration circuit includes: a reference voltage outputting circuit operable to output a reference voltage; an adjustable internal resistor including at least one positive temperature coefficient resistor and at least one negative temperature coefficient resistor; a reference current generating circuit operable to generate an internal resistor reference current according to the reference voltage and the internal resistor and generate an external resistor reference current according to the reference voltage and an external resistor; and a comparison and control circuit operable generate a comparison result according to the internal and external resistor reference currents, and adjust the internal resistor according to the comparison result till the comparison result indicates that the difference between the internal and external resistor reference currents is less than a predetermined threshold or unable to be further reduced.

12 Claims, 3 Drawing Sheets

(56) References Cited

U.S. PATENT DOCUMENTS

| | | | |
|---|---|---|---|
| 2007/0040716 A1* | 2/2007 | Lin | H03M 1/1019 341/120 |
| 2008/0303605 A1* | 12/2008 | Takada | H03F 1/56 333/17.3 |
| 2009/0237151 A1* | 9/2009 | Yoshida | G01C 19/56 327/539 |
| 2010/0289462 A1* | 11/2010 | Wu | H03F 1/30 323/234 |
| 2014/0145702 A1* | 5/2014 | Wu | G05F 1/561 323/315 |
| 2016/0179113 A1* | 6/2016 | Taigor | G11C 16/06 327/513 |

* cited by examiner

RESISTANCE CALIBRATION CIRCUIT AND DEVICE

BACKGROUND OF THE INVENTION

1. Field of the Invention

The present invention relates to a calibration circuit and a calibration device, especially to a resistance calibration circuit and a resistance calibration device.

2. Description of Related Art

Generally speaking, an integrated circuit requires an accurate voltage and/or an accurate current for operation, so as to achieve performance in expectation. A current art usually uses a bandgap circuit to generate an accurate voltage Vbg, and then uses this accurate voltage Vbg and a resistor Rext, that is outside an integrated circuit, to generate an accurate current Vbg/Rext.

However, the aforementioned resistor Rext is connected to the integrated circuit through a pin. Since the current trend is towards miniaturization and low cost, using an additional pin is unfavorable to the trend. Moreover, the resistor Rext itself will cause the volume of the whole circuit (including the said integrated circuit) to increase and the cost to rise.

SUMMARY OF THE INVENTION

In consideration of the problems of the prior art, an object of the present invention is to provide a resistance calibration circuit and a resistance calibration device for making improvements over the prior art.

The present invention disclose a resistance calibration circuit. An embodiment of the resistance calibration circuit is included in an integrated circuit, and comprises a reference voltage outputting circuit, an internal resistor, a reference current generating circuit, and a comparison and control circuit. The reference voltage outputting circuit is configured to output a reference voltage. The internal resistor includes at least one positive temperature coefficient resistor and at least one negative temperature coefficient resistor, in which the resistance of the internal resistor is adjustable. The reference current generating circuit is configured to generate an internal resistor reference current according to the reference voltage and the internal resistor, and configured to generate an external resistor reference current according to the reference voltage and an external resistor. The comparison and control circuit is configured to generate a comparison result according to the internal resistor reference current and the external resistor reference current, and adjust the resistance of the internal resistor according to the comparison result till the comparison result indicates that a difference between the internal resistor reference current and the external resistor reference current is less than a predetermined threshold or unable to be further reduced.

The present invention further discloses a resistance calibration device. An embodiment of the resistance calibration device comprises a reference voltage outputting circuit, an internal resistor, an internal switch, an external resistor, an external switch, a reference current generating circuit, and a comparison and control circuit. The reference voltage outputting circuit is configured to output a reference voltage. The internal resistor includes at least one positive temperature coefficient resistor and at least one negative temperature coefficient resistor, in which the resistance of the internal resistor is adjustable. The internal switch is coupled between the reference voltage outputting circuit and the internal resistor. The external switch is coupled between the reference voltage outputting circuit and the external resistor. The reference current generating circuit is configured to generate an internal resistor reference current according to the reference voltage and the internal resistor when the internal switch is turned on and the external switch is turned off, and configured to generate an external resistor reference current according to the reference voltage and the external resistor when the internal switch is turned off and the external switch is turned on. The comparison and control circuit is configured to generate a comparison result according to the internal resistor reference current and the external resistor reference current, and adjust the resistance of the internal resistor according to the comparison result till the comparison result indicates that a difference between the internal resistor reference current and the external resistor reference current is less than a predetermined threshold or unable to be further reduced. In this embodiment, the reference voltage outputting circuit, the internal switch, the internal resistor and the reference current generating circuit are included in an integrated circuit, the external resistor and the external switch are outside the integrated circuit, and the comparison and control circuit is included in or outside the integrated circuit.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present invention discloses a resistance calibration circuit and a resistance calibration device. The circuit and device are capable of calibrating an internal resistor of an integrated circuit according to an external resistor, while the external resistor will be no longer necessary after the calibration.

Figure 1:
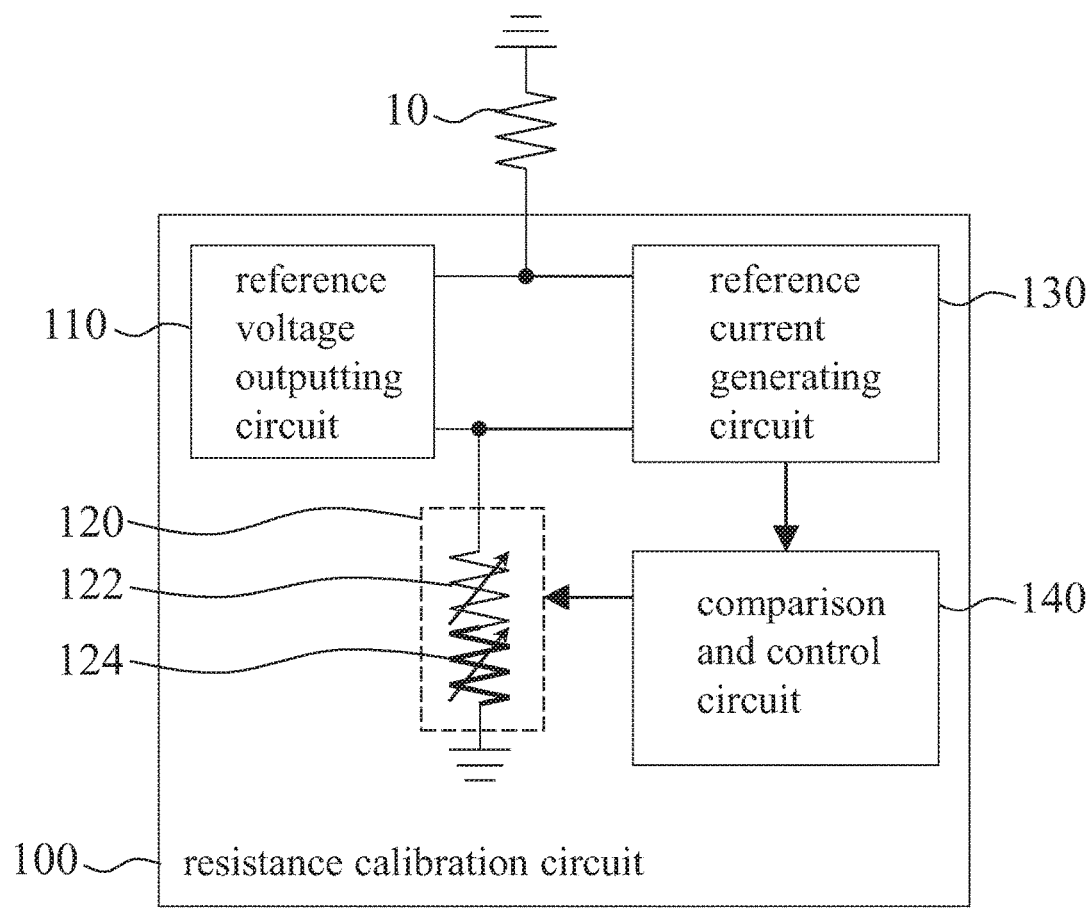
FIG. 1 illustrates an embodiment of the resistance calibration circuit of the present invention.

FIG. 1 shows an embodiment of the resistance calibration circuit of the present invention. Referring to FIG. 1, the resistance calibration circuit 100 is included in an integrated circuit, and the resistance calibration circuit 100 itself includes a reference voltage outputting circuit 110, an internal resistor 120, a reference current generating circuit 130, and a comparison and control circuit 140. In another embodiment of the resistance calibration circuit of the present invention, the comparison and control circuit 140 is set outside the integrated circuit; for instance, the circuit 140 is set in a production and test machine.

Please refer to FIG. 1 again. The reference voltage outputting circuit 110 is configured to provide a reference voltage. An example of the reference voltage is a bandgap voltage or the derivative thereof; another example of the reference voltage is a constant voltage (which is not accurate but sufficient for reference) that is generated by the existing art. The internal resistor 120 is an adjustable resistor including at least one positive temperature coefficient resistor 122 and at least one negative temperature coefficient resistor 124. The positive and negative temperature coefficient resistors 122, 124 could be selected from the resistors as listed in the Table 1 below, or could be selected from other positive and negative temperature coefficient resistors that can be made by or applicable to an integrated circuit process. As the temperature varies, at least a part of the resistance variation of the at least one negative temperature coefficient resistor 124 is balanced off by the resistance variation of the at least one positive temperature coefficient resistor 122, so that the influence of the temperature variation on the internal resistor 120 is relieved. The reference current generating circuit 130 is configured to generate an internal resistor reference current according to the reference voltage and the resistance of the internal resistor 120, and configured to generate an external resistor reference current according to the reference voltage and the resistance of an external resistor 10, in which the external resistor 10 is not included in the aforementioned integrated circuit. The comparison and control circuit 140 is configured to generate a comparison result according to the internal resistor reference current and the external resistor reference current, and adjust the resistance of the internal resistor 120 according to the comparison result till the comparison result indicates that a difference between the internal resistor reference current and the external resistor reference current is less than a predetermined threshold or unable to be further reduced. For instance, when the adjustment in the internal resistor 120 leads to the variation trend of the difference between the internal and external resistor reference currents towards increase from decrease, the comparison and control circuit 140 will determine that the difference cannot be reduced anymore.

TABLE 1

| positive temperature coefficient resistor (resistance = sheet resistance) | negative temperature coefficient resistor (composed of resistors Rend at both ends and resistor Rpure in the middle) (resistance = 2 × Rend + Rpure) |
|---|---|
| P+ Poly w/i Silicide (width ≥2.0) | P+ Poly w/o Silicide (width ≥2.0) |
| P+ Poly w/i Silicide (0.18 ≤ width ≤ 2.0) | N+ Poly w/o Silicide (width ≥2.0) |
| N+ Poly w/i Silicide (width ≥2.0) | |
| N+ Poly w/i Silicide (0.18 ≤ width ≤ 2.0) | |
| N+ diff w/o Silicide (width ≥2.0) | |
| N+ diff w/i Silicide (width ≥2.0) | |
| N+ diff w/i Silicide (0.22 ≤ width ≤ 2.0) | |
| P+ diff w/o Silicide (width ≥2.0) | |
| P+ diff w/i Silicide (width ≥2.0) | |
| P+ diff w/i Silicide (0.22 ≤ width ≤ 2.0) | |
| N-well under OD (width ≥2.0) | |
| N-well under STI (width ≥2.0) | | p.s.
P+: majority carriers are holes;
N+: majority carriers are electrons;
Poly: polysilicon;
diff: diffusion;
w/i: within;
w/o: without;
OD: thin oxide for device;
STI: shallow trench insulation.

Figure 2:
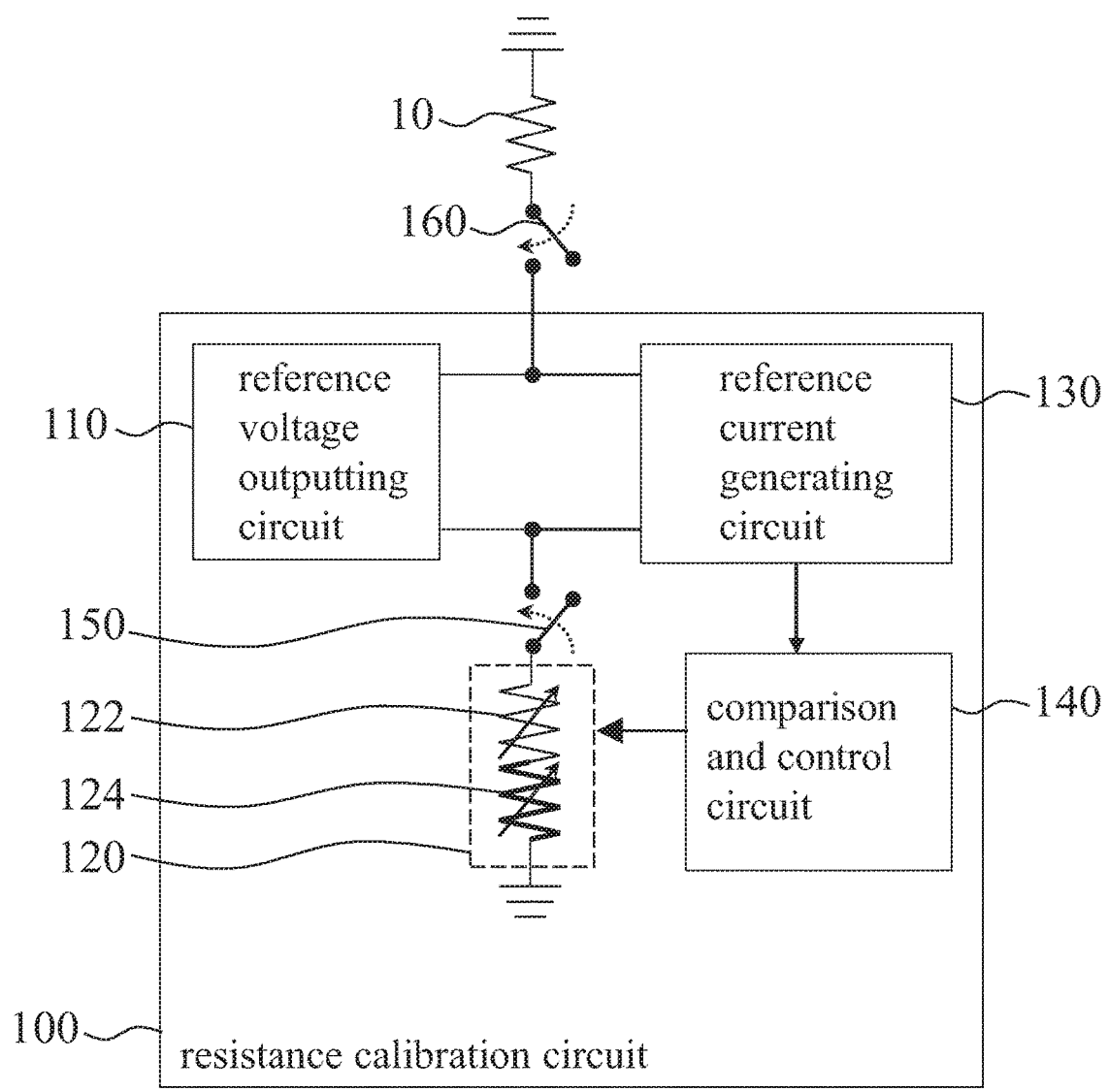
FIG. 2 illustrates an exemplary implementation of the resistance calibration circuit of FIG. 1.

FIG. 2 shows an exemplary implementation of the resistance calibration circuit 100 of FIG. 1. In this exemplary implementation, the reference current generating circuit 130 generates the internal resistor reference current and the external resistor reference current asynchronously, so that the comparison and control circuit 140 receives the internal and external resistor reference currents one by one for comparison. In order to accomplish the above-mentioned procedure, as shown in FIG. 2, the resistance calibration circuit 100 further includes an internal switch 150, while an external switch 160 can be included in the circuit 100 or outside the circuit 100. The internal switch 150 is coupled between the reference voltage outputting circuit 110 and the internal resistor 120, and the external switch 160 is coupled between the reference voltage outputting circuit 110 and the external resistor 10. The reference current generating circuit 130 generates the internal resistor reference current according to the reference voltage and the internal resistor 120 when the internal switch 150 is turned on and the external switch 160 is turned off, and the reference current generating circuit 130 generates the external resistor reference current according to the reference voltage and the external resistor 10 when the internal switch 150 is turned off and the external switch 160 is turned on. It should be noted that in another exemplary implementation, the reference current generating circuit 130 includes two identical/different current generating circuits so as to generate the internal and external resistor reference currents synchronously/at approximately the same time, while the comparison and control circuit 140 includes two identical/different comparison circuits so as to receive the internal and external resistor reference currents synchronously/at approximately the same time for comparison. Since people of ordinary skill in the art can appreciate the detail of the above-described exemplary implementation according to the present disclosure, repeated and redundant description is omitted here. Please note that in FIG. 2 the internal switch 150 can be turned on/off by the comparison and control circuit 140 or some other circuit, and the external switch 160 can be turned on/off by an external operation (e.g., user's operation) or an automatic operation in conjunction with the state of the internal switch 150, in which the external operation and the automatic operation can be realized with the existing arts in this industrial field.

Figure 3:
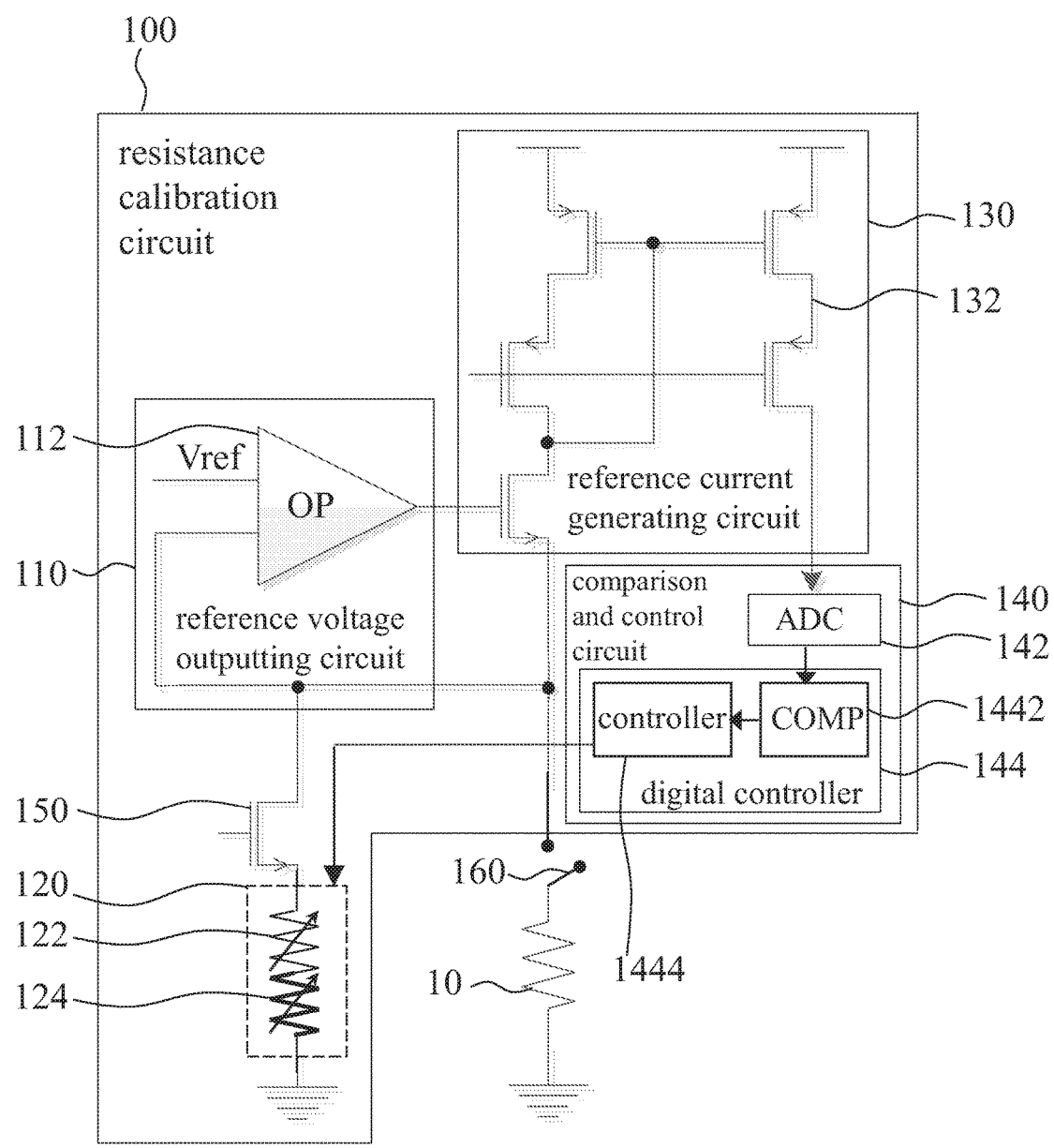
FIG. 3 illustrates an exemplary implementation of the resistance calibration circuit of FIG. 2.

FIG. 3 shows an exemplary implementation of the resistance calibration circuit 100 of FIG. 2. As shown in FIG. 3, the reference voltage outputting circuit 110 includes an amplifier 112 (OP) including a first input terminal, a second input terminal and an output terminal. The first input terminal receives the aforementioned reference voltage (i.e., Vref in the figures), the second input terminal is coupled to the internal resistor 120 or the external resistor 10, and the output terminal is coupled to the reference current generating circuit 130. In addition, the reference current generating circuit 130 includes a current mirror 132 which is configured to provide the internal resistor reference current and the external resistor reference current for the comparison and control circuit 140. Moreover, the comparison and control circuit 140 includes an analog-to-digital converting circuit (ADC) 142 and a digital controller 144. The ADC 142 is configured to generate a first digital value according to the internal resistor reference current and generate a second digital value according to the external resistor reference current in turn. The digital controller 144 including a comparator (i.e., the label "COMP" in FIG. 3) 1442 and a controller 1444, in which the comparator 1442 is configured to generate the aforementioned comparison result according to the first and second digital values, and the controller 1444 is configured to determine whether the difference between the internal and external resistor reference currents is less than the predetermined threshold or unable to be further reduced in light of the comparison result, so as to determine whether the resistance of the internal resistor 120 should be adjusted. When the difference between the internal and external resistor reference currents is less than the predetermined threshold or cannot be reduced anymore, the comparison and control circuit 140 makes the resistance of the internal resistor 120 be fixed (or free from adjustment) through an eFuse or the equivalent thereof (e.g., a memory unit for recording the latest resistance of the internal resistor 120), and the comparison and control circuit 140 has a ratio (e.g., 1:1) of the nominal resistance of the internal resistor 120 to the resistance of the external resistor 10 be fixed. Please note that in order to make FIG. 3 clear and explicit, the connection between the digital controller 144 and the internal resistor 120 is not shown; however, the way to implement the above-mentioned connection is well known in this industrial field, and thus the omitted drawing of the connection has little to do with the understanding of FIG. 3. Additionally, as it is mentioned in the preceding paragraph, the internal switch 150 can be turned on/off by the comparison and control circuit or some other circuit, and the external switch 160 can be turned on/off by an external operation (e.g., user's operation) or an automatic operation in conjunction with the state of the internal switch 150, in which the external and automatic operations can be realized with the existing arts. It should be noted that each of the aforementioned amplifier 112, the current mirror 132, the ADC 142 and the digital controller 144 is well known in this industrial field, and thus the detail is omitted.

The aforementioned external resistor 10 and each of the resistance calibration circuits 100 of FIGS. 1, 2 and 3 can be included in a resistance calibration device. Since those of ordinary skill in the art can appreciate the detail and modification of the resistance calibration device by referring to the description in the preceding paragraphs, repeated and redundant description is therefore omitted without hindering one from understanding and carrying out the resistance calibration device.

To sum up, the resistance calibration circuit and device of the present invention can calibrate an internal resistor inside an integrated circuit in accordance with an external resistor, and stop using the external resistor after the calibration is finished. Accordingly, the present invention has no need to reserve a pin for the connection between the external resistor and the integrated circuit, and thus the circuit area and the cost can be reduced.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A resistance calibration circuit included in an integrated circuit, the resistance calibration circuit comprising:
    a reference voltage outputting circuit configured to output a reference voltage;
    an internal resistor including at least one positive temperature coefficient resistor and at least one negative temperature coefficient resistor, in which a resistance of the internal resistor is adjustable;
    a reference current generating circuit configured to generate an internal resistor reference current according to the reference voltage and the internal resistor, and generate an external resistor reference current according to the reference voltage and an external resistor; and
    a comparison and control circuit configured to generate a comparison result according to the internal resistor reference current and the external resistor reference current, and adjust the resistance of the internal resistor according to the comparison result till the comparison result indicates that a difference between the internal resistor reference current and the external resistor reference current is less than a predetermined threshold or unable to be further reduced;
    wherein the comparison and control circuit includes:
        an analog-to-digital converting circuit configured to generate a first digital value according to the internal resistor reference current, and configured to generate a second digital value according to the external resistor reference current; and
        a digital controller configured to generate the comparison result according to the first digital value and the second digital value, and determine whether the difference between the internal resistor reference current and the external resistor reference current is less than the predetermined threshold or unable to be further reduced in accordance with the comparison result, and thereby determine whether the resistance of the internal resistor needs to be adjusted.

2. The resistance calibration circuit of claim 1, wherein the reference voltage is a bandgap voltage or a derivative of the bandgap voltage.

3. The resistance calibration circuit of claim 1, further comprising:
    an internal switch coupled between the reference voltage outputting circuit and the internal resistor,
    wherein the internal switch is turned on when the reference current generating circuit generates the internal resistor reference current, and the internal switch is turned off when the reference current generating circuit generates the external resistor reference current.

4. The resistance calibration circuit of claim 1, wherein the reference current generating circuit includes a current mirror configured to provide the internal resistor reference current and the external resistor reference current for the comparison and control circuit.

5. The resistance calibration circuit of claim 1, wherein when the difference between the internal resistor reference current and the external resistor reference current is less than the predetermined threshold or unable to be further reduced, the comparison and control circuit makes the resistance of the internal resistor fixed and has a nominal resistance of the internal resistor be equal to a resistance of the external resistor.

6. The resistance calibration circuit of claim 1, wherein the reference voltage outputting circuit includes:
    an amplifier including a first input terminal, a second input terminal and an output terminal, in which the first input terminal is configured to receive the reference voltage, the second input terminal is coupled to the internal resistor or the external resistor, and the output terminal is coupled to the reference current generating circuit.

7. The resistance calibration circuit of claim 1, wherein as a temperature varies, at least some of a resistance variation of the at least one negative temperature coefficient resistor is balanced off by a resistance variation of the at least one positive temperature coefficient resistor.

8. A resistance calibration device, comprising:
    a reference voltage outputting circuit configured to output a reference voltage;

an internal resistor including at least one positive temperature coefficient resistor and at least one negative temperature coefficient resistor, in which a resistance of the internal resistor is adjustable;

an internal switch coupled between the reference voltage outputting circuit and the internal resistor;

an external resistor;

an external switch coupled between the reference voltage outputting circuit and the external resistor;

a reference current generating circuit configured to generate an internal resistor reference current according to the reference voltage and the internal resistor when the internal switch is turned on and the external switch is turned off, and configured to generate an external resistor reference current according to the reference voltage and the external resistor when the internal switch is turned off and the external switch is turned on; and a comparison and control circuit configured to generate a comparison result according to the internal resistor reference current and the external resistor reference current, and adjust the resistance of the internal resistor according to the comparison result till the comparison result indicates that a difference between the internal resistor reference current and the external resistor reference current is less than a predetermined threshold or unable to be further reduced, and the comparison and control circuit including:

an analog-to-digital converting circuit configured to generate a first digital value according to the internal resistor reference current, and configured to generate a second digital value according to the external resistor reference current; and a digital controller configured to generate the comparison result according to the first digital value and the second digital value, and determine whether the difference between the internal resistor reference current and the external resistor reference current is less than the predetermined threshold or unable to be further reduced in accordance with the comparison result, and thereby determine whether the resistance of the internal resistor needs to be adjusted, wherein the reference voltage outputting circuit, the internal switch, the internal resistor and the reference current generating circuit are included in an integrated circuit, the external resistor and the external switch are outside the integrated circuit, and the comparison and control circuit is included in or outside the integrated circuit.

9. The resistance calibration device of claim 8, wherein the reference current generating circuit includes a current mirror configured to provide the internal resistor reference current and the external resistor reference current for the comparison and control circuit.

10. The resistance calibration device of claim 8, wherein when the difference between the internal resistor reference current and the external resistor reference current is less than the predetermined threshold or unable to be further reduced, the comparison and control circuit makes the resistance of the internal resistor fixed and has a ratio of a nominal resistance of the internal resistor to a resistance of the external resistor be fixed.

11. The resistance calibration device of claim 8, wherein the reference voltage outputting circuit includes:

an amplifier including a first input terminal, a second input terminal and an output terminal, in which the first input terminal is configured to receive the reference voltage, the second input terminal is coupled to the internal resistor or the external resistor, and the output terminal is coupled to the reference current generating circuit.

12. The resistance calibration device of claim 8, wherein as a temperature varies, at least some of a resistance variation of the at least one negative temperature coefficient resistor is balanced off by a resistance variation of the at least one positive temperature coefficient resistor.

* * * * *